(12) United States Patent
Hainfeld

(10) Patent No.: US 6,521,773 B1
(45) Date of Patent: Feb. 18, 2003

(54) EXTENDED ORGANIC COBALT AND NICKEL MAGNETIC COMPLEXES

(76) Inventor: James F. Hainfeld, 44 Bradley Dr., Shoreham, NY (US) 11786

( * ) Notice: Subject to any disclaimer, the term of this patent is extended or adjusted under 35 U.S.C. 154(b) by 164 days.

(21) Appl. No.: 09/621,185

(22) Filed: Jul. 21, 2000

(51) Int. Cl.[7] .......................... C07F 15/00; A61K 51/00; A61K 39/395; C07K 16/00
(52) U.S. Cl. ...................... 556/147; 556/148; 530/304; 530/391.4; 424/1.49; 424/1.69; 424/1.73; 424/178.1; 424/179.1
(58) Field of Search ................................. 556/147, 148, 556/28; 530/391.5, 304; 424/1.49, 1.69, 1.73, 178.1, 179.1

(56) References Cited

U.S. PATENT DOCUMENTS

| | | | |
|---|---|---|---|
| 4,795,626 A | 1/1989 | Deutsch et al. | 424/1.1 |
| 5,521,289 A | 5/1996 | Hainfeld et al. | 530/391.5 |
| 5,858,329 A | 1/1999 | Peng et al. | 424/9.361 |
| 5,879,659 A | 3/1999 | Edwards et al. | 424/1.69 |

*Primary Examiner*—Porfirio Nazario-Gonzalez
(74) *Attorney, Agent, or Firm*—Pierce Atwood; Kevin M. Farrell

(57) ABSTRACT

Large cobalt and nickel complexes that may be linked to antibodies and other molecules are described. These may be useful in applications benefiting from their magnetic properties.

59 Claims, No Drawings

EXTENDED ORGANIC COBALT AND NICKEL MAGNETIC COMPLEXES

BACKGROUND—FIELD OF INVENTION

This invention relates to production and use of cobalt and nickel magnetic complexes having an organic component.

BACKGROUND—DISCUSSION OF PRIOR ART

Magnetic Materials

Magnetic materials have many applications including use in computer disk memory storage, audio and video recording tape, sensors, coatings, magneto-optical devices, as magnetic resonance imaging (MRI) contrast agents, and biolabels for molecular or cell tagging or separations. Typically iron oxides, hematite, $Fe_2O_3$, maghemite, gamma-$Fe_2O_3$ and magnetite, $Fe_3O_4$ are used, or various alloys, such as in alnico magnets (aluminum, nickel, cobalt), or mixed oxide materials with octahedral $Fe^{3+}$ ions such as the spinels $BaFe_{12}O_{19}$ and $Ba_2Mn_2Fe_{12}O_{22}$ used in magnetic tapes. Gadolinium, complexed with DTPA (diethylenetriamine pentaacetic acid), Gd-DTPA, is commonly used for MRI enhancement.

Unfortunately the currently available materials have limitations and a number of shortcomings for various applications. Magnetic recording media is far below its potential density due to lack of precise control in preparing and magnetically isolating storage bits and organizing regular smaller elements in arrays. Bulk coatings are annealed and form irregular domains. To provide adequate isolation, larger than desired areas must be assigned to each information bit. Construction instead from optimally sized magnetic nanoparticles could greatly improve recording densities. In the medical field, iron oxide nanoparticles have been used as imaging agents, but these are irregular in size, have associated toxicity, and have imperfect biodistributions when administered in vivo. Gd-DTPA is an accepted MRI contrast agent but has a short blood half life limiting uses requiring longer visualization periods; also when conjugated to a targeting moiety, such as an antibody, it does not generate enough signal to be generally useful for targeted imaging of, for example, tumors, clots, or atherosclerotic plaques. Iron magnetic particles heat up in oscillating magnetic fields, and this effect has been proposed for use in heating tumors to destroy them. Success has been limited by poor specific tumor uptake, lack of sufficient total accumulation, and commensurate toxicity.

Synthesis of magnetic nanoparticles has been by various methods including grinding of macroscopic magnets, use of sonication, micelles, pH adjustment, and controlled oxidation. Unfortunately these lead to heterogeneously sized particles making them undesirable for many applications. It has been difficult to produce uniform small magnetic materials, especially less than 10 nm. These small sizes would be desirable for in vivo use and for improved magnetic storage media.

Another significant problem with formation of magnetic nanoparticles is that they usually aggregate. Most of the reports of the synthesis of magnetic nanoparticles that show electron micrographs of the material clearly demonstrate this problem.

A further problem with many magnetic materials is stability. The particles show altered and degraded magnetic properties after short periods of storage. Many iron particles continue to oxidize, as is common with rusting.

Coating of magnetic particles is important to many applications and has been achieved by mixing the particle with sugars, polymers and various other substances. These suffer from the instability of adsorption since there is some desorption rate. Other particles have been covalently attached to, such as linking to the oxygen of iron oxide particles. Although covalent, the many drawbacks of iron particles, such as instability, poor size distributions, toxicity and aggregation, limit their use.

SUMMARY

The present invention describes a method to synthesize a new class of magnetic materials composed of nickel and cobalt or cobalt/nickel extended complexes. Also disclosed is the covalent linking of these nanoparticles to antibodies or other molecules for targeted delivery, alteration of surface properties, or for incorporation with other materials.

DETAILED DESCRIPTION

Object

It is the object of the present invention to provide a new class of organic magnetic complexes containing nickel and/or cobalt with novel properties, which can also be covalently attached to other molecules.

Unusual Properties

A new class of magnetic material is herein described. Previously, most magnetic nanoparticles reported were solid particles of some magnetic material, such as cobalt or iron oxide; such particles were either used as is, or coated, for example, with dextrans. At the other end of the size spectrum are single magnetic ions complexed with various organic molecules, such as gadolinium-DTPA. In the instant invention, in one embodiment, a small peptide containing a thiol group ("thiol-containing peptide", or "thiol peptide") and various counter ions ligands are used to form extended complexes that link multiple cobalt or nickel atoms with multiple peptides such that the apparent molecular weight is greater than about 3,000 daltons, as gauged by exclusion on a gel filtration column with water as the eluent. The complexes also do not pass through a 3,000 molecular weight (nominal) filter (Amicon Centricon 3), but mostly pass through a 10,000 molecular weight filter (Amicon Centricon 10). Such complexes are termed "extended" or "large" since they differ from low molecular weight complexes such as Gd-DTPA (molecular weight of 548), in that they are much larger in size. The extended complexes are highly water soluble and can be dried, then resuspended easily in water, with no apparent alteration. By electron microscopy, the resultant complexes do not typically have the cobalt or nickel as a dense solid core of metal, but appear to form structures about 0.5 to 5 nm in size, where the metal is more distributed over the complex, giving it a relatively uniform density over its extent. No aggregation is apparent.

Magnetic measurements of a water solution of the cobalt complexes show the magnetic field, M, vs. magnetic field strength, H, to be a straight line with a shallow slope up to 13,000 Gauss, giving no indication of ferromagnetism or superparamagnetism. The molar susceptibility of the material is low, less than about 0.02 (cgs units), in the range of cobalt ions in solution. All of these data are consistent with organometallic complexes where the metal is not highly condensed into a central core. The complexes are dark brown in color and ultraviolet-visible spectroscopy shows a spectrum that decrements from high absorbtion at 240 nm (the shortest wavelength measured) to low absorbtion at 600 nm, with peaks or shoulders at approximately 380 and 450 nm; one form shows a shoulder at about 364 nm. Larger cobalt and nickel complexes are also described that are orange or red in color, and these have peaks or shoulders at longer wavelengths, about 520 to 540 nm. If dried or precipitated by addition of base, the resulting particulates exhibit motion in an inhomogeneous magnetic field. When stored in water at room temperature, there is no apparent change in properties for the cobalt complexes over several months. Not only is the material highly water soluble, but it is not "sticky" and does not adhere to glass surfaces or proteins such as albumin. The organic peptide component allows covalent conjugation to antibodies or other molecules. The complexes appeared to be pure in that they ran as a single peak on a gel filtration column in aqueous buffer, and ran as a single spot on a TLC (thin layer chromatography) plate in 50:50 methanol:water. These unusual characteristics distinguish this new magnetic material from others previously described.

Advantages

The unique properties of this new class of magnetic materials make them ideal for many applications. The high water solubility is useful for biological applications, which are predominantly aqueous solution based. The stability is a valuable asset to almost all uses.

The non-aggregation of particles or complexes is particularly important to their use. Once material aggregates, its properties become altered, the size becomes difficult to control, purification is hampered, and molecular control over their use is generally lost.

The ability to link to antibodies, peptides, nucleic acids, carbohydrates, proteins, and other molecules makes these extended complexes then useful for targeting applications, such as to tumors, atherosclerotic plaques, clots, or specific tissues and cells, or for stably bonding to other molecules, polymers or surfaces to confer magnetic properties.

The extremely small size of the complexes, 0.5–10 nm, makes them ideal for in vivo use, for forming ultrathin layers or coatings, and for rapid diffusion into materials.

Since the complexes do not stick to albumin and many other proteins, they can be used in vivo or in vitro without unwanted non-specific adhesion leading to background or altered biodistributions.

The highly colored nature of the extended complex solutions make them ideal for direct visualization and staining, so that they may be seen without radioactive tags or other secondary enhancement procedures.

The distributed disposition of metal atoms of the invention makes the material ideal for several applications. This refers to the cobalt and nickel atoms being generally dispersed over the complex rather than in a dense central core. For example, in MRI contrast enhancement, the magnetic material works by altering relaxation times of adjacent water protons. For greatest effect, the magnetic atom must be in intimate contact with water molecules. Hence, a complex that permits access to more metal atoms will be more effective than a solid sphere where internal atoms are shielded from water molecules. In this regard, it will have improved MRI enhancement over a solid particle with the same number of magnetic atoms. Relaxivity is determined by a number of factors including type of magnetic atom, molecular rigidity, water exchange rate, hydration number, conjugation to other molecules, number of magnetic atoms, and other factors. Since the present invention differs significantly from others compounds described, it has distinct and unique chemical and physical features and advantages.

The extended complexes of this invention contain multiple cobalt and/or nickel atoms. This has the advantage, that more magnetically active atoms can be delivered by a single antibody when compared to agents that tag antibodies with only one or a few magnetic atoms. For antigen labeling, the amount of magnetic material delivered is directly proportional to the signal obtained or the therapeutic effect. This means that for targeted delivery for imaging or therapy, the sensitivity and efficacy, respectively will be enhanced by use of this probe containing multiple magnetic atoms. In vitro labeling will be similarly improved over use of single magnetic atom labels. For material applications, such as in sensors or coatings, the density of magnetic atoms is also important.

Application of an oscillating magnetic field provides a way to remotely heat magnetic particles, and can permit selective heating in a matrix of only regions containing the magnetic particles. For material applications, use of the extended organic cobalt and nickel magnetic complexes of this invention may aid in nanofabrication, selective polymerization, and other uses where localized heating is required. For in vivo therapy, delivery of the magnetic material, made possible by this invention, to tumors, atherosclerotic plaques, or other tissues that necessitate removal or alteration, would permit an applied field to elevate the temperature in these specific regions, causing cell death or other heat-related responses. This modality of therapy is not currently available clinically due to the usual problems of drug delivery, toxicity, side effects, and lack of sufficient response. The present invention overcomes many of these difficulties. It permits large amounts of non-toxic magnetic material to be specifically targeted to the site of interest.

A further unique feature of the instant invention is the unusual mode of synthesis. It does not follow from existing methods which use sonication, micelles, strong reducing agents, grinding, oxidation, or simple complexing. In a preferred embodiment, cobalt or nickel metal salts are complexed with a thiol peptide (glutathione), citrate, ammonia, and chloride in basic solution to form the extended complexes. This method was discovered fortuitously while searching for a novel form of magnetic nanoparticle, and the method given is a refinement of the original procedure. The instant color change of the solutions from light red, pink, or green to dense, almost opaque brown, without precipitation, was very surprising and unpredicted. However, it was recognized that such color and density changes are similar to formation of other metal colloids and clusters, and result from plasmon interactions of closely spaced metal atoms or alterations in complexing ligands. Also surprising were the findings that the complexes produced were significantly larger than any of the starting reactants, and that they possessed desirable magnetic properties.

The invention also utilizes cobalt and nickel, instead of other commonly used magnetic materials such as iron oxides and gadolinium. The toxicity of cobalt is extremely low in comparison to iron or gadolinium, thus providing a great advantage for in vivo applications.

Coupling of other molecules to these organic cobalt and nickel extended complexes has been found to be possible. This is preferable to other nanoparticles where molecules are attached by adsorption, which leads to instability, since that process is reversible. Several methods have been developed for linking to the complexes of this invention, thus providing flexible protocols for a variety of substances to be attached. One surprisingly successful method discovered is to use Fab' antibody fragments that have one or more free hinge thiols. These are added to the preparation before the thiol peptide is added which then forms the complexes. Complexing of the metal with the thiols therefore incorporates the Fab' during formation of the extended complexes. This is a unique method, specific to the synthesis of these particles, and has not been described elsewhere. It has the advantages that it is rapid and does not require lengthy steps or purifications. Stable conjugates form in only a few seconds.

A second method for linking these cobalt and nickel complexes to other molecules is to covalently couple the desired molecule to other groups on the preformed complex, such as its amino groups, carboxyl groups, or thiol groups. For example, the alpha amino group of the thiol peptide may be linked to by standard crosslinking reagents, such as the use of hydroxysuccinimide esters. Coupling to thiol groups may be by use of maleimides, and carboxyl groups may be linked with carbodiimides, e.g., 1-ethyl-3-(3-dimethylaminopropyl)carbodiimide (EDC) or other such reactions. Other reactive groups and linking agents known in the art may also be utilized.

Therefore, coupling of additional molecules can be done before or after the complex is formed. This then means that Fab', IgG, peptides, hormones, dyes, proteins, nucleic acids, carbohydrates, lipids, nucleic acids, polymers, glass, and virtually any other molecules or surfaces may be covalently attached to the complexes.

Cobalt and nickel may be combined in the preparation so that complexes with mixed composition of magnetic atoms may be produced. This is advantageous by providing a way for particles with hybrid and unique magnetic properties to be formed.

Nickel complexes formed by the described procedure show some alteration in properties over time, and generally a partial reversal of formation after several hours. This is in sharp contrast to the cobalt particles which appear to remain intact over many months. Crosslinking of the organic moiety of the nickel complexes, however, provides a way of stabilizing them.

General Chemical Description

The extended or large organic cobalt and nickel magnetic complexes of this invention are fundamentally complexes of the metal ions Co (II) and Ni (II) with a thiol-containing multidentate bridging ligand ("multidentate thiol-containing organic ligand"), and carboxylate and amine ligands to form complexes that are significantly larger than the individual starting components. Other ligands may also be incorporated into these rich, multi-ligand extended complexes, for example, chloride or hydroxide ions. Hydrodynamic measurements indicate that the fundamental brown-colored complexes formed have a molecular weight that appears to be in the range of 3,000 to 20,000.

The multidentate bridging ligand appears to be critical for formation of these larger complexes, and in a preferred preparation, the thiol peptide glutathione is used. In order to form the extended complexes, additional amine and carboxylate ligands were also employed, preferably ammonia from ammonium ions in basic solution, and citrate from trisodium citrate.

Glutathione is a tripeptide, consisting of gamma-glutamic acid—cysteine—glycine. This provides amine, carboxyl and thiol ligands that coordinate to the metal which typically has 6 coordination sites. This means that bridging coordination complexes can therefore be formed, leading to "extended" or multimeric or larger complexes. Glutathione is also an interesting ligand, since it contains several reactive groups: amine, carboxyl, and thiol, useful for crosslinking to other molecules, thus making the complex of great utility in forming conjugates.

The extended complexes therefore contain multiple coordinated species to the metal atoms. This then also provides a method to directly conjugate molecules that could substitute for one of these ligands during or after synthesis of the complex. For example, it was found that Fab' antibody fragments could be stably incorporated into the complex if they are present during complex formation. This provides a novel and simple method to synthesize conjugates with macromolecules and other molecules.

Although the various components for the extended cobalt and nickel complexes have been defined, it is possible to substitute other analogous substances for the various components. For example, any multidentate ligand that is capable of forming extended complexes by bridging metal ions might be used instead of glutathione, such as alternative peptides or polymers. Also, the other coordinating ligands that have made these complexes possible, e.g., ammonia and citrate, could be substituted with other analogous substances that similarly coordinate with the metals. Some commonly known ligands for cobalt and nickel are $I^-$, $Br^-$, $Cl^-$, $SCN^-$, $F^-$, urea, $OH^-$, acetate, oxalate, water, $NCS^-$, glycine, pyridine, ammonia, ethylene diamine, $SO_3^{2-}$, dipyridine, o-phenanthroline, $NO_2^-$, and $CN^-$.

Preparation

The general method or process of preparation of the cobalt and nickel organic complexes involves the following steps:

1. A salt of cobalt or nickel dissolved in water; a preferred cobalt salt is cobalt chloride, a preferred nickel salt is nickel sulfate. A solution containing both cobalt and nickel is used for mixed metal complexes.
2. A base is prepared; preferred bases are ammonium hydroxide and sodium hydroxide.
3. An aqueous solution of a multidentate thiol-containing organic ligand is prepared; a preferred material is the peptide glutathione.
4. An amine ligand is prepared; a preferred source is an aqueous solution of ammonium chloride (this can be omitted if ammonium hydroxide is used for the base).
5. A carboxylate ligand is prepared; a preferred source is an aqueous solution of trisodium citrate.
6. The above solutions are combined to produce the extended organic cobalt and/or nickel complexes that are highly water soluble; a preferred order of addition is: citrate solution added to the cobalt and/or nickel solution, followed by addition of ammonium hydroxide, and then the thiol peptide. This order maintains everything in soluble form, without precipitates. Other orders of additions lead to essentially similar products, but may produce intermediate precipitates.

A preferred pH of the final preparation for complex formation is 9–10. The amounts and concentrations of the various components are important since outside of some range, the extended complexes do not form, or alternatively, extensive aggregation occurs. Preferred amounts are 20% (by weight) $CoCl_2.6\ H_2O$ or $NiSO_4.6\ H_2O$ in 0.4 ml $H_2O$, 20% $Na_3C_6H_5O_7.2\ H_2O$ in 0.4 ml $H_2O$, 0.4 ml of 2 M $NH_4OH$, and 0.15 ml of 8% glutathione. A preferred final concentration of components used is: 120 mM of cobalt or nickel ions, 100 mM of citrate ions, 20 mM of glutathione, and 0.3 M ammonium hydroxide. Alternatively, the 0.3 M ammonium hydroxide may be replaced with 0.5 M ammonium chloride and 0.3 M sodium hydroxide. Volumes may of course be scaled to produce more or less product. Variation of the different components to some extent around these values will still result in the same or similar product, and excess components not incorporated into the complex may be separated by gel filtration chromatography or other techniques. Successful preparations may be made by scaling these concentration values within limits, but keeping the relative values the same. The preferred molar ratio of components is: 1 mole glutathione: 6 moles cobalt or nickel: 5 moles citrate: 15 moles ammonium hydroxide. Ranges of these components useful for forming the complexes include: 4 to 8 moles cobalt and/or nickel salts, 0.6 to 1.5 moles multidentate thiol-containing organic ligand, 8 to 30 moles amine ligand, and 3 to 7 moles carboxylate ligand, although other combinations are possible.

Surprisingly, the complexes formed have an apparent hydrodynamic molecular weight between 3,000 to 20,000 daltons, far greater than any of the starting components. The weights of the preferred starting components are: $CoCl_2.6 H_2O$: 238; $Na_3C_6H_5O_7.2 H_2O$: 294; $NH_4OH$: 35; glutathione: 309.

Variations

Various "alloy" complexes containing both cobalt and nickel can be made by mixing proportional amounts of the cobalt and nickel salts during synthesis.

Although the size in the described procedure results in extended complexes 0.5 to 10 nm, typically 0.5 to 5 nm, larger complexes from 5 to 20 nm can be obtained by decreasing the amount of thiol complexing agent in the preparation. This results in particles that are orange or red in color, rather than brown, and have sizes in the range of 5 to 20 nm.

EXAMPLES

The following examples are provided only as a sampling of the possibilities defined by this application, and are not intended to be limiting, since variations, extensions, and applications will be obvious to persons skilled in the art.

1. Preparation of Organic Cobalt Complexes

A solution of 20% (by weight) cobalt (II) chloride hexahydrate in 0.4 ml water was mixed with a 20% solution of (tri)sodium citrate in 0.4 ml $H_2O$. Next, 0.4 ml of 2 Molar ammonium hydroxide was added, and the red solution changed to a more pink/purple color. Next, 0.1 ml of an aqueous solution of 8% reduced glutathione was added, and the solution then turned dark brown. After 5 min, and additional aliquot, namely 0.05 ml of an aqueous solution of 8% glutathione was added, and the solution became darker in color.

The product was purified on a gel filtration, sizing column packed with Amicon GH25, and run with water as the eluent. The complexes appeared in the void volume and this step was used to remove any species less than about 3,000 apparent molecular weight, namely, any free cobalt ions or glutathione.

Fractions containing the complexes were dried by vacuum rotary evaporation, then resuspended in a small amount of water. This permitted facile concentration of the product. Electron microscopy confirmed that 0.5 to 10 nm complexes had formed.

2. Preparation of Organic Nickel Complexes 0.2 ml of an aqueous 10% sodium citrate solution was added to 0.2 ml of a 10% aqueous nickel sulfate solution. Next, 0.2 ml of a 1 Molar ammonium hydroxide solution was added. Then 0.05 ml of a 4% aqueous glutathione solution was added and the mixture turned dark brown. After 5 minutes, an additional 0.05 ml of the 4% aqueous glutathione solution was added.

3. Preparation of 10 to 20 nm Organic Cobalt Complexes 0.2 ml of an aqueous 10% sodium citrate solution was added to 0.2 ml of a 10% aqueous cobalt chloride solution. Next, 0.2 ml of a 10% ammonium chloride solution was added, followed by 0.2 ml of a 0.1% sodium hypophosphite aqueous solution. Next, 0.3 ml of a 1 molar ammonium hydroxide solution was added. Then 0.02 ml of a 4% aqueous glutathione solution was added and the mixture turned orange, and later matured over several hours into an orange-red then red solution. In another preparation, similar sized cobalt complexes were formed by mixing 0.2 ml of an aqueous 10% sodium citrate solution with 0.2 ml of a 10% aqueous cobalt chloride solution, followed by addition of 0.4 ml of a 1 molar ammonium hydroxide solution, then addition of 0.05 ml of a 4% aqueous glutathione solution.

4. Preparation of Mixed Cobalt and Nickel Complexes 0.1 ml of a 10% aqueous cobalt chloride solution was mixed with 0.1 ml of a 10% aqueous nickel sulfate solution. 0.2 ml of an aqueous 10% sodium citrate solution was then added. Next, 0.2 ml of a 1 molar ammonium hydroxide solution was added. Then 0.05 ml of a 4% aqueous glutathione solution was added and the mixture turned brown. After 5 minutes, another 0.05 ml of the 4% aqueous glutathione solution was added.

5. Covalent Linking of Antibody to Organic Cobalt or Nickel Extended Complexes During their Preparation, and Targeting of the Complexes to an Antigen Fab' antibody fragments were prepared by reducing 0.2 mg of rabbit anti-mouse with 30 mM dithiothreitol (DTT) in 0.1 molar phosphate buffer, pH 6 containing 5 mM EDTA (ethylenediamine tetraacetic acid) for 1 hr. Fab' antibody fragments were then purified from DTT and other low molecular weight components on a gel exclusion column (Amicon GH25) running with water as the eluent. The protein peak was pooled into a 2 ml volume.

Cobalt or nickel complexes were prepared by mixing a solution of 20% (by weight) cobalt chloride or nickel sulfate in 0.4 ml water with a 20% solution of (tri)sodium citrate in 0.4 ml water. Next, 0.4 ml of 2 Molar ammonium hydroxide was added. Several identical preparations up to this point were made. To some, 1 ml of the purified Fab' antibody solution was added, containing about 0.08 mg of antibody; to others, 0.3 ml of Fab' was added, and others 0.03 ml, and others no antibody was added. 0.1 ml of an aqueous solution of 8% glutathione was added to each reaction, and the solutions then turned dark brown. After 5 min, and additional aliquot, namely 0.05 ml of an aqueous solution of 8% glutathione was added, and the solutions became darker in color.

Although further purification or optimization of reaction amounts and times could have been done, the samples were used immediately. They were all diluted to 2 ml, and 1 ml of each was applied to an immunoblot consisting of 5 micrograms of mouse IgG (the target antigen) bound to nitrocellulose which had been previously dried and blocked with 4% serum albumin. After only 5 minutes, the samples containing the most rabbit anti-mouse Fab' showed targeting of the complexes to the antigen, indicated by a brown spot appearing over the region of antigen. Samples having less Fab' bound showed concomitantly weaker binding which was obvious after 10 minutes. The samples having no Fab' bound showed no binding to the antigen.

In addition, this experiment showed that the complexes with or without the antibody attached had no affinity for albumin, since no coloration of the albumin coated membrane area was observed.

6. Covalent Linking of Antibody to Organic Cobalt or Nickel Extended Complexes After their Preparation, and Targeting of the Complexes to an Antigen Cobalt or nickel organic complexes were prepared and purified as described in examples 1 through 3 above. The free amino groups of the organic peptide in the particles was linked to by mixing with a molar excess of bis(sulfosuccinimidyl) suberate. After 30 min, the particles were purified from excess reagent by gel exclusion chromatography. Rabbit anti-mouse IgG was added and incubated overnight at 4 degrees C. The particles then demonstrated immunotargeting to their appropriate antigen, using the blot method of example 5. This showed that the particles could be covalently coupled using the amino groups of the organic moiety, and could be linked to molecules containing free amino groups.

7. Demonstration of Magnetic Properties of the Cobalt Extended Complexes

Cobalt extended complexes were prepared as described in example 1. The complexes were precipitated by adding additional amounts of glutathione or by addition of sodium hydroxide. The brown precipitate at the bottom of the aqueous solution was then placed near a pole edge of a magnetron magnet, and the particles were drawn to the magnet pole in this inhomogeneous field.

Conclusion, Ramifications, and Scope

The present invention describes a new class of extended organic cobalt and nickel magnetic complexes with unique properties and a process for synthesizing them. It also includes mixed cobalt and nickel extended complexes. The organic moieties permit convenient covalent linking to antibodies, peptides, proteins, carbohydrates, lipids, nucleic acids, or other organic or inorganic molecules by conventional crosslinking technology. A novel incorporation of Fab' antibody fragments, or other thiol compounds during the complex synthesis is also described. These provide a way of targeting the magnetic complexes to sites of interest, in vivo or in vitro, or for coating surfaces, or for inclusion into polymers or other materials. A method of controlling the size of the particles has also been discovered.

The ramifications of this new class of magnetic materials are far reaching since magnetic materials have been found to be useful in many areas including sensors, computer storage, magneto-optical devices, medical imaging and therapy.

What is claimed is:

1. A process for producing water soluble organic cobalt and/or nickel complexes comprising combining in aqueous basic solution the minimal components consisting of:
    a. cobalt and/or nickel salts,
    b. a multidentate thiol-containing organic ligand,
    c. an amine ligand,
    d. a carboxylate ligand,
whereby a water soluble brownish solution results, and the complex has an apparent hydrodynamic molecular weight in the range of 3,000 to 20,000 daltons.

2. The process of claim 1 wherein said multidentate thiol-containing organic ligand is a peptide.

3. The process of claim 1 wherein said multidentate thiol-containing organic ligand is glutathione.

4. The process of claim 1 wherein said amine ligand is ammonia.

5. The process of claim 1 wherein said carboxylate ligand is citrate.

6. The process of claim 1 wherein the final molar ratio of components is within the range of:
    a. 4 to 8 moles cobalt and/or nickel salts,
    b. 0.6 to 1.5 moles multidentate thiol-containing organic ligand,
    c. 8 to 30 moles amine ligand, and
    d. 3 to 7 moles carboxylate ligand.

7. A process for producing water soluble organic cobalt and/or nickel complexes comprising combining in aqueous basic solution the minimal components consisting of:
    a. cobalt and/or nickel salts,
    b. a multidentate thiol-containing organic ligand,
    c. an amine ligand,
    d. a carboxylate ligand
    e. an organic thiol-containing ligand selected from the group consisting of antibody fragments, antibodies, peptides and proteins, organic molecules, nucleic acids, carbohydrates, and lipids.

8. The process of claim 7 wherein said multidentate thiol-containing organic ligand is glutathione.

9. The process of claim 7 wherein said amine ligand is ammonia.

10. The process of claim 7 wherein said carboxylate ligand is citrate.

11. An organic cobalt complex which is magnetic and has a hydrodynamic molecular weight from 3,000 daltons to 20,000 daltons, and is produced by a method comprising combining components:
    a) a cobalt salt;
    b) a carboxylate salt;
    c) an amine salt; and
    d) a multidentate thiol-containing organic molecule;
in an aqueous, basic mixture, until the mixture becomes brown in color.

12. The organic cobalt complex of claim 11 wherein the aqueous basic mixture is from pH 9 to pH 10.

13. The organic cobalt complex of claim 11 wherein the cobalt salt is $CoCl_2.6H_2O$.

14. The organic cobalt complex of claim 11 wherein the carboxylate salt is a citrate salt.

15. The organic cobalt complex of claim 11 wherein the amine salt is an ammonium salt.

16. The organic cobalt complex of claim 11 wherein the multidentate thiol-containing organic molecule is a peptide.

17. The organic cobalt complex of claim 16 wherein the peptide is reduced glutathione.

18. The organic cobalt complex of claim 11 wherein a molar ratio of 6:5:15:1 cobalt salt:carboxylate salt:amine salt:multidentate thiol-containing organic molecule are combined.

19. The organic cobalt complex of claim 11 wherein the method comprises combining 4 to 8 moles of cobalt salt, and 3 to 7 moles carboxylate salt and 8 to 30 moles amine salt, and 0.6 to 1.5 moles multidentate thiol-containing organic molecule.

20. The organic cobalt complex of claim 19 wherein the method comprises combining 6 moles of cobalt salt, and 5 moles carboxylate salt, and 15 moles amine salt, and 1 mole multidentate thiol-containing organic molecule.

21. The organic cobalt complex of claim 11 wherein the components are combined in the order:
    a) combining the cobalt salt with the carboxylate salt in an aqueous mixture;
    b) adding the amine salt to the aqueous mixture of step a), and if necessary adjusting the pH of the mixture, to produce an aqueous basic mixture; and
    c) adding the multidentate thiol-containing organic molecule to the aqueous basic mixture produced in step b) to produce a mixture which is brown in color.

22. An organic nickel complex which is magnetic and has a hydrodynamic molecular weight from 3,000 daltons to 20,000 daltons, and is produced by a method comprising combining components:
    a. a nickel salt;
    b. a carboxylate salt;

c. an amine salt; and
d. a multidentate thiol-containing organic molecule;
in an aqueous, basic mixture, until the mixture becomes brown in color.

23. The organic nickel complex of claim 22 wherein the aqueous basic mixture is from pH 9 to pH 10.

24. The organic nickel complex of claim 22 wherein the nickel salt is $NiSO_4.6H_2O$.

25. The organic nickel complex of claim 22 wherein the carboxylate salt is a citrate salt.

26. The organic nickel complex of claim 22 wherein the amine salt is an ammonium salt.

27. The organic nickel complex of claim 22 wherein the multidentate thiol-containing organic molecule is a peptide.

28. The organic nickel complex of claim 27 wherein the peptide is reduced glutathione.

29. The organic nickel complex of claim 22 wherein the nickel salt, carboxylate salt, amine salt, and multidentate thiol-containing organic molecule components of the method are combined at a molar ratio of 6:5:15:1.

30. The organic nickel complex of claim 22 wherein the method comprises combining 4 to 8 moles of nickel salt, and 3 to 7 moles carboxylate salt, and 8 to 30 moles amine salt, and 0.6 to 1.5 moles multidentate thiol-containing organic molecule.

31. The organic nickel complex of claim 30 wherein the method comprises combining 6 moles of nickel salt, and 5 moles carboxylate salt, and 15 moles amine salt, and 1 mole multidentate thiol-containing organic molecule.

32. The organic nickel complex of claim 22 wherein the components are combined in the order:
   a) combining the nickel salt with the carboxylate salt in an aqueous mixture;
   b) adding the amine salt to the aqueous mixture of step a), and if necessary adjusting the pH of the mixture, to produce an aqueous basic mixture; and
   c) adding the multidentate thiol-containing organic molecule to the mixture produced in step b) to produce a mixture which is brown in color.

33. An organic cobalt and nickel complex which is magnetic and which has a hydrodynamic molecular weight from 3,000 daltons to 20,000 daltons, and is produced by a method comprising combining components:
   a) a cobalt salt;
   b) a nickel salt;
   c) a carboxylate salt;
   d) an amine salt; and
   e) a multidentate thiol-containing organic molecule;
in an aqueous, basic mixture, until the mixture becomes brown in color.

34. The organic cobalt and nickel complex of claim 33 wherein the aqueous basic mixture is from pH 9 to pH 10.

35. The organic cobalt and nickel complex of claim 33 wherein the cobalt salt is $CoCl_2.6H_2O$.

36. The organic cobalt and nickel complex of claim 33 wherein the nickel salt is $NiSO_4.6H_2O$.

37. The organic cobalt and nickel complex of claim 33 wherein the carboxylate salt is a citrate salt.

38. The organic cobalt and nickel complex of claim 33 wherein the amine salt of step b) is an ammonium salt.

39. The organic cobalt and nickel complex of claim 33 wherein the multidentate thiol-containing organic molecule of step c) is a peptide.

40. The organic cobalt and nickel complex of claim 39 wherein the peptide is reduced glutathione.

41. The organic cobalt and nickel complex of claim 33 wherein the method comprises combining 4 to 8 moles total of combined cobalt salt and nickel salt, and 3 to 7 moles carboxylate salt, and 8 to 30 moles amine salt, and 0.6 to 1.5 moles multidentate thiol-containing organic molecule.

42. The organic cobalt and nickel complex of claim 33 wherein the components are combined in the order:
   a) combining the cobalt salt and the nickel salt with a carboxylate salt in an aqueous mixture;
   b) adding the amine salt to the aqueous mixture of step a) to produce an aqueous basic mixture; and
   c) adding the multidentate thiol-containing organic molecule to the aqueous basic mixture produced in step b) to produce a mixture which is brown in color.

43. An organic cobalt complex which is magnetic and which is from 0.5 to 10 nm in size, produced by a method comprising the steps:
   a) adding 1 volume-unit 20% cobalt(II) chloride hexahydrate in water, with 1 volume-unit 20% (tri)sodium citrate in water, to produce a mixture which is red in color;
   b) adding 1 volume-unit 2 molar ammonium hydroxide to the red mixture produced in step a) to produce a mixture which is purple in color;
   c) adding ¼ volume-unit 8% reduced glutathione in water to the purple mixture produced in step b) and mixing to until a brown mixture is produced; and
   d) adding ⅛ volume-unit 8% reduced glutathione to the brown mixture produced in step c) and mixing until the brown mixture darkens in color.

44. An organic cobalt complex which is magnetic and which is from 10 nm to 20 nm in size and is produced by a method comprising the following steps, in the recited order:
   a) adding 1 volume-unit 10% sodium citrate solution in water to 1 volume-unit 10% cobalt chloride solution in water to produce a mixture;
   b) adding 1 volume-unit 10% ammonium chloride solution in water to the mixture;
   c) adding 1 volume-unit 0.1% sodium hypophosphate in water to the mixture;
   d) adding 1⅓ volume-unit 1 molar ammonium hydroxide solution to the mixture;
   e) adding 1/10 volume-unit 4% aqueous reduced glutathione solution to the mixture to produce a color change of the mixture to orange; and
   f) optionally incubating the mixture for a period of time to result in a color change of the mixture from orange to red.

45. An organic cobalt complex which is magnetic and which is from 10 nm to 20 nm in size, produced by a method comprising the following steps, in the recited order:
   a) adding 1 volume-unit 10% sodium citrate solution in water to 1 volume-unit 10% cobalt chloride solution in water to produce a mixture;
   b) adding 2 volume-unit 1 molar ammonium hydroxide solution to the mixture; and
   c) adding ¼ volume-unit aqueous reduced glutathione solution to the mixture to produce a mixture which is red in color.

46. An organic cobalt and nickel complex which is magnetic, produced by a method comprising the following steps, in the recited order:
   a) adding 1 volume-unit 10% cobalt chloride solution in water to 1 volume-unit 10% nickel sulfate solution in water, to produce a mixture;
   b) adding 2 volume-unit 10% sodium citrate solution in water to the mixture;

c) adding 2 volume-unit 1 molar ammonium hydroxide solution in water to the mixture;

d) adding ½ volume-unit 4% aqueous reduced glutathione solution to the mixture, thus producing a color change in the mixture to brown; and e) adding ½ volume-unit 4% aqueous reduced glutathione solution to the brown mixture.

47. An organic nickel complex which is magnetic and is from 0.5 to 10 nm in size, produced by a method comprising the following steps, in the recited order:

a) adding 1 volume-unit 10% sodium citrate in water, to 1 volume-unit 10% nickel sulfate in water, to produce a mixture;

b) adding 1 volume-unit 1 molar ammonium hydroxide to the mixture;

c) adding ¼ volume-unit 4% aqueous reduced glutathione in water to the mixture and mixing to produce a color change of the mixture to brown; and d) incubating the brown mixture for 5 minutes and then adding ¼ volume-unit 4% aqueous reduced glutathione.

48. An organic nickel complex which is magnetic and is from 0.5 to 10 nm in size, produced by a method comprising the steps:

a) adding 1 volume-unit 20% (tri)sodium citrate in water, to 1 volume-unit 20% nickel sulfate in water, to produce an aqueous mixture;

b) adding 1 volume-unit 2 molar ammonium hydroxide to the mixture produced in step a) to produce an aqueous, basic mixture;

c) adding ¼ volume-unit 8% aqueous reduced glutathione in water to the aqueous basic mixture produced in step b) and mixing to produce a brown mixture; and d) incubating the brown mixture of step c) for 5 minutes and then adding ⅛ volume-unit 8% aqueous reduced glutathione to the brown mixture of step c) and mixing until the brown mixture darkens in color.

49. An organic cobalt complex which is magnetic and is produced by a method comprising the following steps, in the recited order:

a) combining a cobalt salt with a carboxylate ligand to produce a mixture;

b) adding an amine salt to the mixture; and c) adding a thiol-containing molecule selected from the group consisting of antibody fragments, antibodies, polypeptides, organic molecules, nucleic acids, carbohydrate, and lipids to the mixture; and d) adding a multidentate thiol-containing organic ligand to the mixture produced in step c) to produce a color change in the mixture to brown.

50. An organic cobalt complex which is magnetic and is produced by a method comprising the steps:

a) combining a cobalt salt with a carboxylate salt in an aqueous mixture;

b) adding an amine salt to the aqueous mixture produced in step a) to produce an aqueous basic mixture;

c) adding a multidentate thiol-containing organic molecule to the aqueous basic mixture produced in step b) to produce a color change in the mixture to brown, the brown mixture containing organic magnetic cobalt complexes which have a hydrodynamic molecular weight from 3,000 daltons to 20,000 daltons;

d) adding an amount of crosslinking reagent which is in molar excess of the organic magnetic cobalt complexes contained in the brown mixture to the brown mixture;

e) purifying particles which have a hydrodynamic molecular weight from 3,000 daltons to 20,000 daltons from the incubated mixture produced in step d); and f) adding a thiol-containing molecule selected from the group consisting of antibody fragments, antibodies, polypeptides, organic molecules, nucleic acids, carbohydrate, and lipids, to the particles purified in step d) and incubating under conditions sufficient to cross link the particles to the thiol-containing molecule.

51. An organic cobalt complex which comprises a carboxylate ligand, an amine ligand, and a multidentate thiol-containing organic ligand, the cobalt atoms being linked to one another within the complex by thiol groups and counter ions, the complex having the following properties:

a) stable;

b) water soluble;

c) non-aggregating;

d) magnetic; and e) from 0.5 to 10 nm in size.

52. The organic cobalt complex of claim 51 which, when in solid form, exhibits motion in an inhomogeneous magnetic field.

53. The organic cobalt complex of claim 51 which is dark brown in color.

54. The organic cobalt complex of claim 51 which is orange or red in color.

55. The organic cobalt complex of claim 51 which is covalently linked to an antibody.

56. The organic cobalt complex of claim 51 which is covalently linked to glass.

57. The organic cobalt complex of claim 51 which is covalently linked to a polymer.

58. The organic cobalt complex of claim 51 which is covalently linked to a molecule selected from the group consisting of polypeptide, nucleic acid, carbohydrate, and lipid.

59. An organic nickel complex which comprises a carboxylate ligand, an amine ligand, and a multidentate thiol-containing organic ligand, the nickel atoms being linked to one another within the complex by thiol groups and counter ions, the complex having the following properties:

a) water soluble;

b) non-aggregating;

c) magnetic; and d) from 0.5 to 10 nm in size.

* * * * *